United States Patent [19]

Maxwell et al.

[11] Patent Number: 5,824,423

[45] Date of Patent: Oct. 20, 1998

[54] THERMAL BARRIER COATING SYSTEM AND METHODS

[75] Inventors: Douglas Hugh Maxwell, Southlake, Tex.; Giel Marijnissen, Beringe, Netherlands

[73] Assignee: N.V. Interturbine, Netherlands

[21] Appl. No.: 597,841

[22] Filed: Feb. 7, 1996

[51] Int. Cl.$^6$ .............................. B32B 15/00; B32B 15/20
[52] U.S. Cl. ......................... 428/623; 428/632; 428/633; 428/937
[58] Field of Search ....................... 428/623, 632, 428/633, 937, 678, 679; 416/241 R, 241 B

[56] References Cited

U.S. PATENT DOCUMENTS

| | | |
|---|---|---|
| Re. 32,121 | 4/1986 | Gupta et al. . |
| Re. 33,876 | 4/1992 | Goward et al. . |
| 3,542,530 | 11/1970 | Talboom, Jr. et al. ............. 29/183.5 |
| 3,676,085 | 7/1972 | Evans et al. ......................... 29/194 |
| 3,754,903 | 8/1973 | Goward et al. . |
| 3,928,026 | 12/1975 | Hecht et al. ....................... 75/134 |
| 4,055,705 | 10/1977 | Stecura et al. . |
| 4,248,940 | 2/1981 | Goward et al. . |
| 4,255,495 | 3/1981 | Levine et al. . |
| 4,321,310 | 3/1982 | Ulion et al. . |
| 4,321,311 | 3/1982 | Strangman . |
| 4,401,697 | 8/1983 | Strangman . |
| 4,405,659 | 9/1983 | Strangman . |
| 4,405,660 | 9/1983 | Ulion et al. . |
| 4,414,249 | 11/1983 | Ulion et al. . |
| 4,585,481 | 4/1986 | Gupta et al. . |
| 4,835,011 | 5/1989 | Olson et al. . |
| 4,880,614 | 11/1989 | Strangman et al. . |
| 4,916,022 | 4/1990 | Solfest et al. .................. 428/633 X |
| 5,015,502 | 5/1991 | Strangman et al. . |
| 5,087,477 | 2/1992 | Giggins, Jr. et al. . |
| 5,238,752 | 8/1993 | Duderstadt et al. . |
| 5,254,413 | 10/1993 | Maricocchi . |
| 5,262,245 | 11/1993 | Ulion et al. . |
| 5,281,487 | 1/1994 | Rumaner et al. . |
| 5,320,909 | 6/1994 | Scharman et al. . |
| 5,352,540 | 10/1994 | Schienle et al. ................ 428/633 X |
| 5,427,866 | 6/1995 | Nagaraj et al. . |
| 5,455,119 | 10/1995 | Taylor et al. . |
| 5,498,484 | 3/1996 | Duderstadt ...................... 428/632 X |
| 5,512,382 | 4/1996 | Strangman ........................ 428/632 |
| 5,514,482 | 5/1996 | Strangman ........................ 428/623 |
| 5,562,998 | 10/1996 | Strangman ...................... 428/623 X |

FOREIGN PATENT DOCUMENTS

| | | |
|---|---|---|
| 2 252 567 | 8/1992 | United Kingdom . |
| 2 285 632 | 7/1995 | United Kingdom . |

OTHER PUBLICATIONS

Stecura, "Effects of Yttrium, Aluminum and Chromium Concentrations in Bond Coatings on the Performance of Zirconia–Yttria Thermal Barriers", *Thin Solid Films*, 73:481–489 (1980).

"Deposit Reactive Element Aluminides Industrially", *Advanced Coatings & Surface Technology*, p. 2 (Sep. 1995).

"Hot Corrosion of Yttrium–modified Aluminide Coatings", *Materials Science and Engineering*, A121:387–389 (1989).

"The Effect of 0.1 Atomic Percent Zirconium on the Cyclic Oxidation Behavior of β–NiAl for 3000 Hours at 1200° C.", *NASA Technical Memorandum 101408*, pp. 1–16.

*Primary Examiner*—Daniel Zirker
*Attorney, Agent, or Firm*—Testa, Hurwitz & Thibeault, LLP

[57] ABSTRACT

Disclosed is an improved bond coat of a thermal barrier coating system useful for enhancing adhesion of a ceramic topcoat to a superalloy substrate. The bond coat includes about 13 to 30 weight percent aluminum, between trace and about 3 weight percent of a reactive element selected from the group consisting of yttrium, zirconium, lanthanum, and scandium, and mixtures thereof, and balance selected from the group consisting of nickel, cobalt, iron and mixtures thereof, wherein said bond coat is further characterized by absence of added chromium. A preferred method includes plasma spraying a prealloyed powder of the bond coat composition on the substrate followed by alumina formation and ceramic topcoat deposition. Uses include thermal barrier coating systems on gas turbine engine hot section components such as turbine blade and vane airfoils, combustors, and exhaust nozzles.

11 Claims, 1 Drawing Sheet

THERMAL BARRIER COATING SYSTEM AND METHODS

TECHNICAL FIELD

The present invention relates to protective coatings for metallic articles and more particularly to an improved bond coat of a ceramic thermal barrier coating system for superalloy substrates.

BACKGROUND INFORMATION

During gas turbine engine operation, hot section components such as turbine blade and vane airfoils, combustors, and exhaust nozzles are subject to oxidizing and corrosive, high temperature combustion effluent gas. Because these components often are subjected concurrently to high magnitude thermally and mechanically induced stress, the art has developed a variety of techniques in the design and manufacture of these components to ensure maintenance of structural and metallurgical integrity throughout the operating range of the engine. For example, components typically are manufactured from material compositions such as nickel- and cobalt-base superalloys having desirable properties at elevated, operating range temperatures. In the case of turbine airfoils, the selected alloy generally is formed by casting. For enhanced high temperature strength, grain structure advantageously may be controlled during solidification of the casting to produce a directionally solidified or single crystal form, thereby providing greater strength for a given alloy composition.

In addition to component strength enhancement by selection of alloy composition and control of the casting process, both internal and external cooling schemes are employed extensively to maintain component temperatures below critical levels. Tailored film cooling of external surfaces and sophisticated turbulent flow cooling of serpentine shaped internal cavities in the cast airfoils are routinely utilized in advanced gas turbine engine designs respectively to decrease the thermal energy input to the component and reduce the temperature rise thereof.

Despite efforts to optimize these varied approaches, both alone and in combination, advanced gas turbine engine design efficiency is limited by the inability of the hot section components to achieve acceptable operating lives under increased mechanical and thermal loading. An additional method employed by those skilled in the art of gas turbine engine design is the use of a relatively thin ceramic insulative outer layer on surfaces exposed to the effluent gas flow. This facilitates component operation at greater operating temperatures. These coatings, generally referred to in the industry as thermal barrier coatings or TBCs effectively shield the metallic substrate of the component from temperature extremes. By reducing the thermal energy input to the component, higher combustion effluent gas temperatures and/or more efficient use of cooling flows are realized with a resultant increase in engine operating efficiency.

Ceramic coatings are prone to delamination at or near the ceramic/substrate interface due to differences in coefficients of thermal expansion between the relatively brittle ceramic and the more ductile superalloy substrate. Subsequently, the ceramic may spall or separate from the component surface. This failure mechanism is aggravated and accelerated under conditions of thermal cycling inherent in gas turbine engine operation. In order to prevent premature failure of the ceramic, methods of providing strain tolerant ceramic coatings have been developed. Certain moderate service applications employ porous or pre-cracked ceramic layers. In more harsh operating environments, such as those found in advanced gas turbine engines, the art exploits strain tolerant open columnar ceramic crystal structures, such as those described in U.S. Pat. No. 4,321,311 to Strangman. Substantial attention also has been directed to the use of an intermediate or bond coat layer disposed between the substrate and the ceramic layer. The bond coat employs a composition designed both to enhance the chemical bond strength between the ceramic and metal substrate as well as to serve as a protective coating in the event of premature ceramic topcoat loss.

There are presently two primary classes of bond coat compositions conventionally employed in multilayered TBC systems of this type, each exhibiting inherent deficiencies which inhibit their useful life. One type of metallic bond coat typically specified by gas turbine engine designers is referred to as MCrAlY alloy, where M is iron, cobalt, nickel or mixtures thereof. The other major constituents, namely chromium, aluminum and yttrium, are represented by their elemental symbols. In coating a superalloy substrate, the MCrAlY bond coat first is applied to the substrate by a method such as physical vapor deposition ("PVD") or low pressure plasma spraying. The MCrAlY class of alloys are characteristically very resistant to oxidation at the elevated temperatures experienced by hot section components due to their ability to form a thin adherent protective external film of aluminum oxide or alumina. In addition to providing protection, the alumina film also provides a chemically compatible surface on which to grow the insulative ceramic topcoat. As known by those having skill in the art, the ceramic topcoat most commonly employ zirconium oxide or zirconia, either partially or fully stabilized through the addition of oxides of yttrium, magnesium, or calcium. By growing an open columnar structured stabilized zirconia on the alumina film, the multilayered coating exhibits improved integrity under cyclic thermal conditions over ceramic coatings disposed directly on the metallic substrate, thereby providing the intended insulative protection to the underlying component over an extended period.

While such MCrAlY-based TBC systems have been shown to demonstrate improved life over systems lacking the MCrAlY bond coat altogether, ceramic topcoat spalling and failure continue to occur, albeit after a greater number of thermal cycles. It has generally been accepted that the failure mechanism is related to diffusion of substrate alloy constituents through the MCrAlY bond coat layer. Because the MCrAlY alloys are primarily of the solid solution type, they offer little resistance to diffusion of elements from the underlying superalloy substrate which are detrimental to interfacial bond strength. Upon reaching the intermediate alumina layer, the presence of the diffused constituents causes deterioration of the MCrAlY/alumina bond strength and acceleration in the growth rate of the alumina film with resultant deterioration and failure of the ceramic topcoat.

Another type of metallic bond coat routinely specified by those skilled in the art includes a class of materials known as aluminides. These are popular compositions for gas turbine engine components and include nickel, cobalt, and iron modified aluminides as well as platinum modified aluminides. Generally, aluminides are intermediate phases or intermetallic compounds with physical, chemical, and mechanical properties substantially different from the more conventional MCrAlY bond coats. As discussed hereinbelow, some aluminide compositions are known to be useful coatings in and of themselves for protecting iron-, cobalt-, and nickel-base alloys from oxidation and corrosion; however, some aluminides may be used as bond coats for ceramic topcoats in TBC systems.

The aluminide-based TBC system is similar to the MCrAlY-based TBC system insofar as the aluminide bond coat is first formed on the substrate surface by conventional diffusion processes such as pack cementation as described by Duderstadt et al. in U.S. Pat. No. 5,238,752 and Strangman in published U.K. Patent Application GB 2,285,632A, the disclosures of which are incorporated herein by reference. The aluminide coated component also has a surface composition which readily forms a protective alumina film when oxidized. A ceramic topcoat of conventional composition and structure, as described hereinabove, completes the TBC system.

As with the MCrAlY-based TBC, the weak link in the aluminide-based TBC is the strength of the bond between the aluminide bond coat and the intermediate alumina layer. However, instead of degrading as a function of diffusional instability as in MCrAlY-based TBC systems, the aluminide/alumina bond is inherently relatively weak. The failure mechanism for these conventional aluminide diffusion coatings is the repeated formation, spalling, and reformation of the alumina film under thermal cycling conditions of typical gas turbine engine service, with the eventual depletion of aluminum in the aluminide bond coat below a critical concentration.

In spite of the operational deficiencies of the aluminide-based TBC systems, there are several recognized advantages of aluminide-based TBC systems over MCrAlY-based TBC systems. For example, aluminide bond coats typically are applied by lower cost processes and do not include the expensive strategic constituent chromium required in MCrAlY bond coats. Further, the aluminide bond coats have a substantially higher melting point and lower density. These are important considerations when coating parts such as turbine blade airfoils which operate at high temperatures and high rotational speeds. More important, however, aluminide bond coats exhibit substantially lower solubility for the substrate alloy solute elements, thereby retarding their diffusion in service to the critically important aluminide/alumina interfacial bond.

Major deficiencies associated with aluminide bond coats are related to the inherent metallurgical characteristics resulting from creation of the bond coat by diffusion. Production of a conventional aluminide bond coat relies upon reaction of the substrate alloy with aluminum from an aluminum rich gaseous source and interdiffusion with the metallic substrate. The gaseous aluminum source may be produced by any of a variety of conventional methods. For example, Duderstadt et al. discusses production of an aluminide bond coat on a nickel- or cobalt-base superalloy substrate preferably by the pack cementation method. According to this method, aluminum from an aluminum halide gas in the pack mixture reacts and interdiffuses with the substrate surface over time at elevated temperature. Strangman discusses production of aluminide bond coats by reacting a nickel-, iron-, or cobalt-base superalloy component substrate with an aluminum rich vapor at elevated temperature. Strangman refers exclusively to the term "diffusion aluminide" as characteristic of the resultant bond coat. This characterization accurately corresponds to the method of aluminide bond coat production, namely by diffusion. As a result of the diffusion method, the aluminide bond coat contains nickel, iron, or cobalt from the substrate of the component being coated, depending on the primary constituent of the superalloy substrate. Further, many of the base alloying elements of the substrate which are ultimately detrimental to TBC system integrity are necessarily also contained in the reaction product aluminide forming on the component surface. These alloying elements therefore are present in the aluminide bond coat as produced, and are available to affect detrimentally the alumina film that eventually forms thereon.

Another significant deficiency of aluminide bond coats is related to the aluminide composition as it affects adherence of the alumina film or scale. Strangman discloses the addition of silicon, hafnium, platinum, and oxides particles such as alumina, yttria, and hafnia to the aluminide composition to improve alumina film adherence. However, the beneficial effects of these elements are offset at least partially by the presence of the base alloy elements previously described which are detrimental to satisfactory alumina adherence.

As stated hereinabove, some aluminide compositions are used not as bond coats in TBC systems, but rather solely as protective coatings without ceramic topcoats. In such applications, a goal of those skilled in the art is to protect the underlying article substrate from chemically aggressive effluent gases by retarding environmental deterioration of the substrate alloy due to accelerated oxidation and hot corrosion. There has been research conducted and patents granted on the beneficial effects of reactive element additions primarily to aluminide coatings used solely for coating purposes. For example, U.S. Pat. No. 4,835,011 to Olson et al., the disclosure of which is incorporated herein by reference, describes a method of forming a diffusion aluminide coating on a nickel- or cobalt-base superalloy by heating the article to be coated in the presence of a powder mixture containing an alloy or mixture of aluminum, yttrium, and one or more of chromium, nickel, cobalt, silicon, and titanium; a halide activator such as cobalt iodide; and an inert filler such as yttrium oxide. Reference may also be made to an article entitled "Hot Corrosion of Yttrium-modified Aluminide Coatings," Materials Science and Engineering, A121 (1989) pp. 387–389, in which the researchers discuss improved hot corrosion resistance of aluminide coatings when modified with yttrium. Further, in NASA Technical Memorandum 101408, entitled "The Effect of 0.1 Atomic Percent Zirconium on the Cyclic Oxidation Behavior of β-NiAl for 3000 Hours at 1200° C.," C. A. Barrett describes the beneficial effects of zirconium on the cyclic oxidation resistance of nickel aluminide. None of these references disclose or contemplate use of any of these compositions as a bond coat in a ceramic TBC system.

The consequences of TBC system failure are tangible and costly. Firstly, thermal operating margin must be factored into the design of the gas turbine engine to preclude overtemperature and failure of hot section components. By limiting combustion parameters to less than stoichiometric, the realizable efficiency of the engine is reduced with increase in fuel consumption as well as levels of unburnt hydrocarbons and other pollutants. Further, baseline engine operating parameters are premised on the existence of uniform ceramic topcoats, and ceramic topcoat life is often significantly less than underlying component life. This means engines must be removed from service for maintenance at predetermined intervals, based, for example, on operating hours or thermal cycles. Combustor, turbine, and exhaust modules are disassembled and the coated parts removed, stripped, inspected and recoated. Significant costs are attributable to aircraft and engine unavailability. Further, substantial direct costs are associated with labor, tooling, and materials required to remove, recoat, and reinstall the affected hardware. Yet further unscheduled engine removals are forced whenever borescope inspection of the internal configuration of the engine reveals TBC system degradation beyond predetermined field service limits, further disrupting operations and increasing support costs.

SUMMARY OF THE INVENTION

An improved TBC system and methods of application are disclosed, primarily for use on nickel- and cobalt-base superalloy articles such as hot section components of gas turbine engines. A superalloy substrate is first coated with a bond coat having an MAlY composition where M is nickel, cobalt, iron or combinations thereof. An intermediate layer of alumina is formed on the MAlY bond coat and a ceramic topcoat is applied overall. As used herein, the chemical symbol "Y" signifies the use of reactive elements such as yttrium. Also, as used herein, the term "alumina" signifies predominantly aluminum oxide which may be altered by the presence of reactive elements to contain, for example, yttrium or zirconium oxides.

The bond strength or adherence between the MAlY bond coat and alumina film is enhanced over conventional aluminide and MCrAlY bond coats by substantially restricting the composition of the bond coat to between about 13 to 30 weight percent aluminum, between trace and about 3 weight percent yttrium or other reactive element such as zirconium, lanthanum, or scandium, either alone or in mixtures thereof, and balance selected from nickel, cobalt and iron, either alone or in mixtures thereof. By specifically excluding chromium from the bond coat in the aforementioned compositional ranges in combination with the increase in aluminum content, diffusional stability of the chromium-free MAlY bond coat is significantly improved over conventional MCrAlY bond coats. As a result, the invention provides a substantial reduction in diffusion of substrate alloy constituents through the MAlY bond coat, and maintenance of a strong MAlY/alumina bond resistant to degradation as a function of time at elevated temperature, with a concomitant enhancement in ceramic topcoat integrity.

A further benefit from the exclusion of chromium from the bond coat relates to the high vapor pressure of chromium and chromium oxidation products. At intermediate operational temperatures, for example between about 700° C. and about 950° C., the beneficial effects of chromium for sulfidation or hot corrosion resistance typically dominate detrimental effects; however, at higher service temperatures, pure oxidation resistance and thermal protection are dominant goals of those skilled in the art. It is in this operating range, where advanced TBC systems are required to perform, that high chromium content in the bond coat can be detrimental.

Yet further, the MAlY/alumina bond is stronger than that of a conventional modified aluminide/alumina bond. In addition, the growth rate of the alumina film is reduced by the presence of yttrium or other reactive element and the combined effect exhibits improvement over conventional aluminide-based TBC systems.

Various methods may be employed to apply the improved MAlY bond coat to a superalloy article substrate. For example, in a first method similar to that employed to apply a conventional bond coat, yttrium and/or other reactive element first is deposited on the substrate using electron beam PVD followed by gas phase or pack cementation aluminizing. Although this method has the deficiencies previously described with respect to diffusion aluminides, the presence of yttrium or other reactive element markedly improves the oxide scale adherence for the aforementioned reasons. Simple physical or chemical vapor deposition of reactive elements on the surface of a conventional aluminide coating could be effected to bring about the desired surface composition modification. Alternatively, in preferred embodiment methods, ion PVD or sputtering may be employed to coat the substrate using a prealloyed MAlY cathode. Yet another preferred method employs vacuum or low pressure plasma spraying of prealloyed MAlY powder onto the substrate. One additional method involves the deposition of nickel and simultaneous deposition of an aluminum yttrium alloy powder. In all three preferred methods, the coated component is subsequently subjected to a thermal processing cycle to metallurgically bond the coating to the component surface and in the last example to compositionally homogenize the coating. Typically, a heat treatment in vacuum for approximately two hours at about 1080° C. would be employed to effect the metallurgical bond. According to the preferred methods, the MAlY bond coat thus produced at most contain traces of alloying constituents from the superalloy substrate, because the composition of the MAlY bond coat is established prior to its application onto the substrate surface and because its application does not exploit a diffusion reaction involving the substrate. Accordingly, the bond coat is substantially chromium-free. Some minor amount of chromium might diffuse into the bond coat over an extended period at operational temperatures. The anticipated detrimental effects of this are considered minor as compared with other coating alternatives, due both to the inconsequential amount of diffused chromium and the extraordinarily long time period required relative to the useful life of the underlying component. In all of the methods, alumina growth on the deposited MAlY bond coat and application of the ceramic topcoat may be accomplished by conventional methods.

BRIEF DESCRIPTION OF THE DRAWINGS

The invention, in accordance with preferred and exemplary embodiments, together with further advantages thereof, is more particularly described in the following detailed description taken in conjunction with the accompanying drawings in which.

MODE(S) FOR CARRYING OUT THE INVENTION

Figure 1:
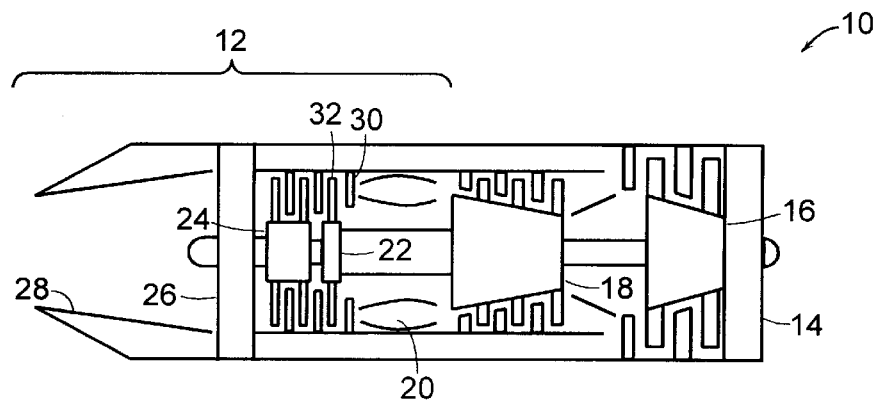
FIG. 1 is a schematic, cross-sectional view of a typical gas turbine engine depicting hot section components suitable for application of a TBC system in accordance with a preferred embodiment of the present invention.

Depicted in FIG. 1 is a schematic, cross-sectional view of a typical turbofan gas turbine engine 10 depicting hot section components, shown generally at 12, suitable for application of a MAlY-base TBC system in accordance with a preferred embodiment of the present invention. As depicted, the engine 10 includes, in serial flow relation from inlet to exhaust, an inlet frame 14, a two stage low pressure compressor ("LPC") or fan 16, a three stage high pressure compressor ("HPC") 18, a combustor 20, a single stage high pressure turbine ("HPT") 22, a two stage low pressure turbine ("LPT") 24, a turbine frame 26, and an exhaust nozzle 28.

Compressed air exiting the HPC 18 is mixed with fuel in the combustor 20 and ignited. The high temperature, high energy combustion effluent passes through both the HPT 22 and LPT 24 where energy is extracted to drive the HPC 18 and fan 16. Each turbine stage, for example HPT 22, includes a set of stationary turbine vanes 30 and rotating turbine blades 32 disposed in the effluent stream to optimize flow orientation and energy extraction. After passing through the turbine frame 24, which supports the rotating components of the engine 10, the effluent is mixed with the fan flow and passes through the exhaust nozzle 28, producing a net force or thrust which propels the engine 10 forward.

Hot section components 12 exposed to the high temperature, corrosive combustion effluent may be coated with the MAlY bond coat TBC system, in accordance with the teachings of this invention, to protect the superalloy substrate from excessive temperature as well as oxidation during engine operation.

Figure 2A:
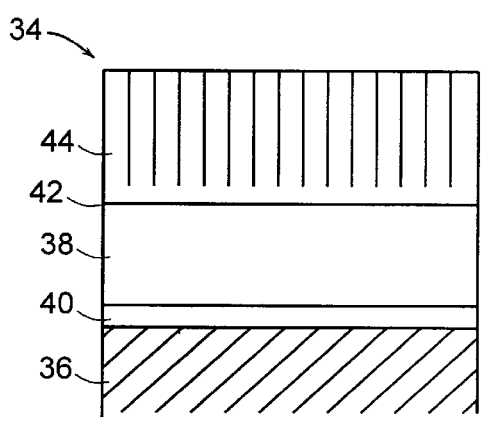
FIG. 2A is an enlarged schematic, cross-sectional view of a portion of a superalloy article coated with a TBC system in accordance with a preferred embodiment of the present invention.
Figure 2B:
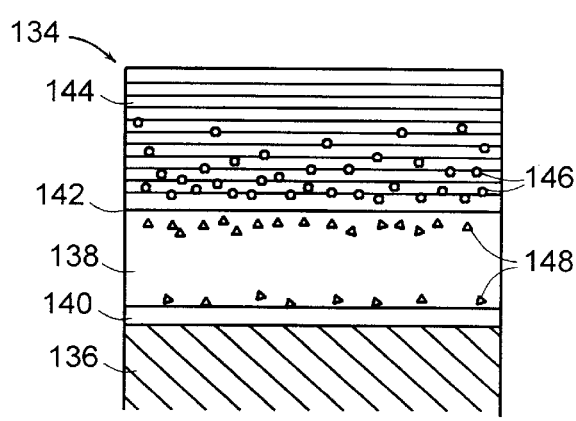
FIG. 2B is an enlarged schematic, cross-sectional view of a portion of a superalloy article coated with a TBC system in accordance with an alternative embodiment of the present invention.

Referring now to FIG. 2A, depicted is an enlarged schematic, cross-sectional view of a portion of a superalloy article 34, such as an airfoil wall of a turbine blade 32, coated with the MAlY bond coat TBC system in accordance with a preferred embodiment of the present invention. Schematic representation and relative thickness of each layer of the multilayered TBC systems depicted in FIGS. 2A and 2B are meant for illustrative purposes only and in no manner are intended to restrict the scope of the invention.

The article 34 in FIG. 2A includes a substrate 36, a portion of which is depicted. The substrate 36 is preferably composed of a nickel- or cobalt-base superalloy; however, it is contemplated that the MAlY bond coat of the present invention may be suitable for use with any superalloy or other metallic substrates with which it may form an adequate bond. For purposes herein, adequate bond may be characterized as adherence equal or superior to that between other layers in the TBC system.

Produced on the substrate 36 is a MAlY bond coat 38 having a composition of about 13 to 30 weight percent aluminum, between trace and about 3 weight percent of a reactive element such as yttrium, zirconium, lanthanum, or scandium, or mixtures thereof, and balance being nickel, cobalt, iron or mixtures thereof. In a preferred composition, bond coat 38 includes about 20 to 22 weight percent aluminum, about 0.25 to 0.4 weight percent yttrium, and balance nickel. In both instances, chromium is purposely omitted from the bond coat 38, although some inconsequential, inadvertent trace amount might conceivably exist therein. The bond coat 38 is preferably produced by means of low pressure or vacuum plasma spray using a prealloyed powder, rather than conventional diffusion methods such as pack cementation. An exemplary plasma spray method is disclosed, for example, in U.S. Pat. No. Re. 33,876 to Goward et al., the disclosure of which is incorporated herein by reference. By using a plasma spray method, the composition of the bond coat 38 may be controlled better and the migration of base alloy elements from the substrate 36, which might otherwise pose a detriment to bond coat/alumina adherence, may be reduced markedly. A relatively thin diffusion zone 40 inherently forms between the bond coat 38 and substrate 36 supporting the bond therebetween.

Due to the highly reactive nature of the MAlY bond coat 38 during production of the TBC system, aluminum proximate the exposed outer surface of the bond coat 38 substantially instantaneously oxidizes upon exposure to any oxygen or moisture containing environment at elevated temperature, resulting in a thin layer of aluminum oxide or alumina 42. Such an oxidized layer may also be referred to as an alumina film or scale. Lastly, a ceramic topcoat 44 is disposed on the alumina film 42 to achieve the desired insulative properties of the TBC system. As depicted, the preferred ceramic topcoat 44 has a columnar microstructure, substantially consistent with that disclosed in U.S. Pat. No. 4,321,311 to Strangman, the disclosure of which is incorporated herein by reference. The columnar ceramic topcoat 44 preferably is produced by electron beam PVD, although other techniques consistent with the production of such columnar microstructure may be used as desired. An exemplary PVD method and apparatus is disclosed in U.S. Pat. No. 4,880,614 to Strangman et al., the disclosure of which is incorporated herein by reference.

Referring now to FIG. 2B, depicted is an enlarged schematic, cross-sectional view of a portion of a superalloy article 134 coated with a TBC system in accordance with an alternative embodiment of the present invention. The article 134 includes a substrate 136, preferably composed of a nickel- or cobalt-base superalloy. However, it is contemplated that the MAlY bond coat of the present embodiment of the invention also may be suitable for use with any superalloy or other metallic substrates with which it may form an adequate bond.

Produced on the substrate 136 is a MAlY bond coat 138 having a composition of about 13 to 30 weight percent aluminum, between trace and about 3 weight percent of a reactive element such as yttrium, zirconium, lanthanum, or scandium, or mixtures thereof, and balance being nickel, cobalt, iron or mixtures thereof. In a preferred composition, bond coat 138 includes about 20 to 22 weight percent aluminum, about 0.25 to 0.4 weight percent yttrium, and balance nickel. Here again, chromium is purposely omitted from the bond coat 138. In this embodiment, the bond coat 138 is produced by first applying yttrium to the substrate 136 by any conventional method, such as electron beam PVD. Thereafter, the MAlY bond coat 138 may be produced by gas phase aluminizing. According to this process, the superalloy substrate 136 is reacted with an aluminum halide gas at elevated temperature for a length of time sufficient to produce the desired bond coat thickness and composition in accordance with the aforementioned constituent ranges. Clearly, the method is not restricted to gas phase aluminizing in that any source of aluminum may be employed to support the aluminizing step.

As is represented schematically in FIG. 2B, the MAlY bond coat 138 includes both the aluminide coating and embedded yttrium rich intermetallic phase particles 148. Clearly, if the underlying substrate 136 is a nickel-base alloy, then the coating formed will be nickel aluminide. Similarly, if the substrate is a cobalt-base alloy, the coating formed will be cobalt aluminide. Further, if instead of first applying yttrium to the substrate 136, zirconium, lanthanum, or scandium were applied in sufficiently high concentration, the resultant particles 148 would be rich in the applied reactive element.

As with the embodiment of FIG. 2A, a relatively thin diffusion zone 140 inherently forms between the bond coat 138 and substrate 136 supporting the bond therebetween. The diffusion zone 140 may contain the diffused reactive element first applied.

Due to the highly reactive nature of the MAlY bond coat 138 during production of the TBC system in FIG. 2B, aluminum proximate the exposed outer surface of the bond coat 138 substantially instantaneously oxidizes upon exposure to oxygen or moisture containing environment at elevated temperature, resulting in a thin layer of alumina 142. Lastly, a ceramic topcoat 144 is disposed on the alumina film 142 to achieve the desired insulative properties of the TBC system. As depicted, the preferred ceramic topcoat 144 has a non-columnar but strain tolerant morphology produced by plasma spraying techniques, although other conventional methods of application may be employed as desired. The plasma sprayed ceramic topcoat 144 may be uniformly dense, or may exhibit controlled porosity as depicted generally at 146, having a substantially nonporous external surface and increasing porosity proximate the alumina layer 142.

The average thickness of individual layers of the multi-layered TBC systems depicted in FIGS. 2A and 2B may be selected by those skilled in the art to achieve a desired insulative result. In a typical application in a gas turbine engine 10 or other harsh environment, the thickness of bond coat 38, 138 may be between about 40 and 120 microns; the thickness of the alumina film 42, 142 between about 0.1 and 3 microns; and the thickness of the ceramic topcoat 44, 144 between about 80 and 350 microns. These ranges are exemplary. Values outside these ranges, alone or in combination, are considered within the scope of the invention. In a preferred embodiment for an airfoil of a gas turbine engine blade 32 or vane 30, the thickness of bond coat 38, 138 may be between about 50 and 80 microns; that of the alumina film 42, 142 may be between about 0.5 and 1.5 microns; and that of the ceramic topcoat 44, 144 may be between about 100 and 150 microns.

While there have been described herein what are to be considered exemplary and preferred embodiments of the present invention, other modifications of the invention will become apparent to those skilled in the art from the teachings herein. It is therefore desired to be secured in the appended claims all such modifications as fall within the true spirit and scope of the invention. Accordingly, what is desired to be secured by Letters Patent is the invention as defined and differentiated in the following claims.

We claim:

1. A substantially chromium-free bond coat of a thermal barrier coating system on a superalloy substrate, the thermal barrier coating system including a ceramic topcoat, said bond coat comprising:

20 to about 30 weight percent aluminum;

between trace amounts and about 3 weight percent of a reactive element selected from the group consisting of yttrium, zirconium, lanthanum, and scandium, and mixtures thereof; and balance selected from the group consisting of nickel, cobalt, iron and mixtures thereof, wherein said bond coat is further characterized by an absence of chromium, said bond coat having a thickness of less than 90 microns.

2. The invention according to claim 1 wherein said bond coat comprises:

20 to about 22 weight percent aluminum;

about 0.25 to 0.4 weight percent yttrium; and balance nickel.

3. A substantially chromium-free bond coat of a thermal barrier coating system on a superalloy substrate, the thermal barrier coating system including a ceramic topcoat, said bond coat consisting essentially of:

20 to about 30 weight percent aluminum;

between trace amounts and about 3 weight percent of a reactive element selected from the group consisting of yttrium, zirconium, lanthanum, and scandium, and mixtures thereof; and balance selected from the group consisting of nickel, cobalt, iron and mixtures thereof, said bond coat having a thickness of less than 90 microns.

4. The invention according to claim 3 wherein said bond coat consists essentially of:

20 to about 22 weight percent aluminum;

about 0.25 to 0.4 weight percent yttrium; and balance nickel.

5. A thermal barrier coating system comprising:

a substantially chromium-free bond coat comprising:

20 to about 30 weight percent aluminum;

between trace amounts and about 3 weight percent of a reactive element selected from the group consisting of yttrium, zirconium, lanthanum, and scandium, and mixtures thereof; and balance selected from the group consisting of nickel, cobalt, iron and mixtures thereof, wherein said bond coat is further characterized by an absence of chromium, said bond coat having a thickness of less than 90 microns;

an alumina layer on said bond coat; and a ceramic topcoat on said alumina layer.

6. The invention according to claim 5 wherein said bond coat comprises:

20 to about 22 weight percent aluminum;

about 0.25 to 0.4 weight percent yttrium; and balance nickel.

7. A coated article comprising:

a superalloy substrate; and a thermal barrier coating system on said substrate, said thermal barrier coating system comprising:

a substantially chromium-free bond coat on said substrate, said bond coat comprising:

20 to about 30 weight percent aluminum;

between trace amounts and about 3 weight percent of a reactive element selected from the group consisting of yttrium, zirconium, lanthanum, and scandium, and mixtures thereof; and balance selected from the group consisting of nickel, cobalt, iron and mixtures thereof, wherein said bond coat is further characterized by an absence of chromium, said bond coating having a thickness of less than 90 microns;

an alumina layer on said bond coat; and a ceramic topcoat on said alumina layer.

8. The invention according to claim 7 wherein said bond coat comprises:

20 to about 22 weight percent aluminum;

about 0.25 to 0.4 weight percent yttrium; and balance nickel.

9. The invention according to claim 7 wherein said superalloy substrate comprises a superalloy selected from the group of nickel-base superalloy and cobalt-base superalloy.

10. The invention according to claim 7 wherein said coated article comprises an engine part, at least a portion of which is exposed to combustion effluent during operation thereof.

11. The invention according to claim 10 wherein said engine part is selected from the group consisting of combustors, turbine blades, turbine vanes, turbine frames and exhaust nozzles.

* * * * *